US012795980B2

(12) United States Patent
Chun et al.

(10) Patent No.: US 12,795,980 B2
(45) Date of Patent: Nov. 10, 2026

(54) SEMICONDUCTOR DEVICE AND METHOD OF MANUFACTURING THE SAME

(71) Applicants: HYUNDAI MOTOR COMPANY, Seoul (KR); KIA CORPORATION, Seoul (KR)

(72) Inventors: Dae Hwan Chun, Suwon-si (KR); Junghee Park, Suwon-si (KR); Jungyeop Hong, Seoul (KR); Taehyun Kim, Suwon-si (KR); Youngkyun Jung, Seoul (KR); NackYong Joo, Suwon-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 329 days.

(21) Appl. No.: 18/529,864

(22) Filed: Dec. 5, 2023

(65) Prior Publication Data

US 2024/0395923 A1 Nov. 28, 2024

(30) Foreign Application Priority Data

May 22, 2023 (KR) ........................ 10-2023-0065371

(51) Int. Cl.

| | |
|---|---|
| ***H10D 62/80*** | (2025.01) |
| ***H10D 30/47*** | (2025.01) |
| ***H10D 64/01*** | (2025.01) |
| ***H10D 64/27*** | (2025.01) |
| ***H10D 99/00*** | (2025.01) |
| ***H10W 74/10*** | (2026.01) |

(52) U.S. Cl.
CPC ......... *H10D 30/4755* (2025.01); *H10D 62/80* (2025.01); *H10D 64/01* (2025.01); *H10D 64/513* (2025.01); *H10D 99/00* (2025.01); *H10W 74/137* (2026.01)

(58) Field of Classification Search
CPC .... H10D 30/4755; H10D 99/00; H10D 64/01; H10D 64/513; H10D 62/80; H10D 74/137
USPC ............................................................ 257/43
See application file for complete search history.

(56) References Cited

U.S. PATENT DOCUMENTS

| | | | | |
|---|---|---|---|---|
| 6,603,173 B1 * | 8/2003 | Okabe | H10D 62/127 257/E29.066 |
| 2002/0000612 A1 * | 1/2002 | Todd | H10D 30/65 257/341 |
| 2003/0042538 A1 | 3/2003 | Kumar et al. | |
| 2012/0205772 A1 * | 8/2012 | Chen | H10D 64/117 438/570 |
| 2015/0162427 A1 * | 6/2015 | Lee | H10D 30/4755 257/190 |
| 2021/0288167 A1 * | 9/2021 | Shih | H10D 10/821 |

(Continued)

*Primary Examiner* — Daniel A Hess
(74) *Attorney, Agent, or Firm* — MCDONNELL BOEHNEN HULBERT & BERGHOFF LLP

(57) ABSTRACT

Provided are a semiconductor device and a method of manufacturing the same, the semiconductor device including a substrate, a buffer layer on the substrate, an n− type epitaxial layer on the buffer layer, a protective layer on the n− type epitaxial layer, a p type layer disposed in a trench structure on the protective layer, and penetrating the protective layer and within the n− type epitaxial layer, a gate insulating layer on the p type layer, and a gate electrode on the gate insulating layer.

16 Claims, 20 Drawing Sheets

(56) References Cited

U.S. PATENT DOCUMENTS

| | | | | |
|---|---|---|---|---|
| 2023/0045172 | A1* | 2/2023 | Joo | ...................... H10D 12/481 |
| 2024/0136301 | A1* | 4/2024 | Pak | ....................... H10W 46/00 |

* cited by examiner

SEMICONDUCTOR DEVICE AND METHOD OF MANUFACTURING THE SAME

CROSS REFERENCE TO RELATED APPLICATIONS

This application claims priority to and the benefit of Korean Patent Application No. 10-2023-0065371 filed in the Korean Intellectual Property Office on May 22, 2023, the entire contents of which are incorporated herein by reference.

BACKGROUND

(a) Field

A semiconductor device and a method of manufacturing the same are disclosed.

(b) Description of the Related Art

An electric power conversion device such as an inverter, a converter, and OBC (on board charge) plays a role of converting electrical energy to suit electrical components, and in these power conversion components, an electric power semiconductor performs switching and rectification operations.

A conventional electric power semiconductor mainly uses a silicon (Si) material, but recently, gallium nitride (GaN) and silicon carbide (SiC) electric power semiconductors with improved performance have begun to be mass-produced and installed in vehicles.

Gallium oxide (Ga2O3), which is attracting attentions as a next generation compound semiconductor material, is capable of high-quality and large-area substrate growth in addition to a high threshold electric field and excellent electron transport ability and thus has advantages of not only better performance but also easier manufacturing process than conventional GaN or SiC. Accordingly, a Ga2O3-based electric power semiconductor is expected to be competitive in various fields such as high electric power devices, RF devices, short-wavelength optical devices, and the like.

In this regard, an ion implantation process method for forming p type Ga2O3 has recently been researched but is not stable enough to commercialize.

SUMMARY

An embodiment provides a semiconductor device that may be manufactured without the ion implantation process, implement a normally-off operation, and exhibit increased breakdown voltage characteristics.

Another embodiment provides a method of manufacturing the semiconductor device.

According to an embodiment, a semiconductor device includes a substrate, a buffer layer on the substrate, an n− type epitaxial layer on the buffer layer, a protective layer on the n− type epitaxial layer, a p type layer disposed in a trench structure on the protective layer, and penetrating the protective layer and within the n− type epitaxial layer, a gate insulating layer on the p type layer; and a gate electrode on the gate insulating layer.

The semiconductor device may further include an n+ type epitaxial layer on the n− type epitaxial layer, a source electrode on the n+ type epitaxial layer and the protective layer, and a drain electrode on the n+ type epitaxial layer and the protective layer.

The p type layer may include NiOX ($0.98 \leq x \leq 1$).

The buffer layer may include unintentionally doped (UID) gallium oxide.

The n− type epitaxial layer may include n− type gallium oxide.

The n− type epitaxial layer may have a concentration of about 1E16 cm-3 to about 1E19 cm-3.

The protective layer may include SiO2, Si2N3, or a combination thereof.

The gate insulating layer may include Al2O3, SiO2, HfO2, Si2N3 or a combination thereof.

The n+ type epitaxial layer may include n+ type gallium oxide.

According to another embodiment, a method of manufacturing a semiconductor device includes sequentially forming a buffer layer and an n− type epitaxial layer on a substrate, forming a protective layer on the n− type epitaxial layer, etching the protective layer and etching a portion of the n− type epitaxial layer through the protective layer to form a trench structure, forming a p type layer on the protective layer and the n− type epitaxial layer along the trench structure, forming a gate insulating layer on the p type layer, and forming a gate electrode on the gate insulating layer.

The forming of the p type layer, the gate insulating layer, and the gate electrode may be performed by a lift-off process or an etching process.

The method may further include forming and etching an n+ type epitaxial layer on the n− type epitaxial layer before the forming of a protective layer on the n− type epitaxial layer, and the protective layer is formed on the n+ type epitaxial layer and the n− type epitaxial layer.

After the forming of the gate electrode, the method may further include forming a source electrode and a drain electrode on the n+ type epitaxial layer and the protective layer.

After the forming of the gate electrode, the forming of the source electrode and the drain electrode may be performed by a lift-off process or an etching process.

At the same time as forming the gate electrode, the method may further include forming a source electrode and a drain electrode on the n+ type epitaxial layer and the protective layer.

At the same time as forming the gate electrode, the forming of the source electrode and the drain electrode may include sequentially depositing a gate electrode material, a source electrode material, and a drain electrode material on the gate insulating layer and performing a lift-off process or an etching process.

The semiconductor device according to an embodiment may be manufactured without an ion implantation process, implement a normally-off operation, increase a threshold voltage but remove a gate leakage current, and exhibit increased breakdown voltage characteristics.

DETAILED DESCRIPTION OF THE EMBODIMENTS

Figure 1:
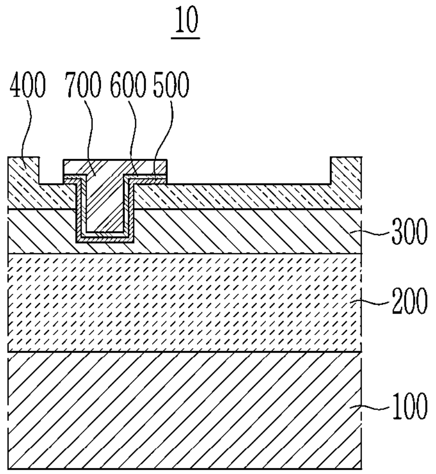
FIG. 1 is a view briefly illustrating a cross section of a semiconductor device according to an embodiment.

The advantages, features, and aspects to be described hereinafter will become apparent from the following description of the embodiments with reference to the accompanying drawings, which is set forth hereinafter. However, the embodiments should not be construed as being limited to the embodiments set forth herein. Although not specifically defined, all of the terms including the technical and scientific terms used herein have meanings understood by ordinary persons skilled in the art. The terms defined in a generally-used dictionary may not be interpreted ideally or exaggeratedly unless clearly defined. Throughout the specification and claims which follow, unless explicitly described to the contrary, the word "comprise/include" or variations such as "comprises/includes" or "comprising/including" will be understood to imply the inclusion of stated elements but not the exclusion or any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

The semiconductor device according to an embodiment has a metal oxide semiconductor field effect transistor (MOSFET) structure based on a gallium oxide (Ga2O3) material, which is an UWBG (ultra-wide bandgap) material, and also, has a structure to which a trench gate is applied.

FIG. 1 is a view briefly illustrating a cross section of a semiconductor device according to an embodiment.

Referring to FIG. 1, a semiconductor device 10 includes a substrate 100, a buffer layer 200, an n− type epitaxial layer 300, a protective layer 400, a p type layer 500, a gate insulating layer 600, and a gate electrode 700.

The substrate 100 may include an n+ type gallium oxide (Ga2O3), sapphire (Al2O3), or a combination thereof. The n+ type gallium oxide may optionally use an Si or Sn-doped n+ type gallium oxide.

The buffer layer 200 may be disposed on the substrate 100 and include an unintentionally doped (UID) gallium oxide (Ga2O3).

The n− type epitaxial layer 300 is disposed as an epitaxial layer on the buffer layer 200. The n− type epitaxial layer 300 may include an n− type gallium oxide (Ga2O3) and optionally, an Si or Sn-doped n− type gallium oxide.

The n− type epitaxial layer 300 may be formed by adjusting an impurity concentration to have a range of 1E16 cm-3 to 1E19 cm-3 and within the range, for example, a range of 1E16 cm-3 to 1E18 cm-3. When the impurity concentration is within the above range, it is possible to secure appropriate values for use of the on-resistance and breakdown voltage characteristics, which are in a trade-off relationship.

The protective layer 400 is disposed on the n− type epitaxial layer 300. The protective layer 400 may include SiO2, Si2N3, or a combination thereof but is not limited thereto.

The p type layer 500 is disposed to form a trench structure on the protective layer 400 and through the protective layer 400 into the n− type epitaxial layer 300.

In the n− type epitaxial layer 300, a depth of the trench structure may be shorter than a thickness of the n− type epitaxial layer 300. Specifically, the thickness of the n− type epitaxial layer 300, which is left after etching into the trench structure, that is, a distance from the bottom of the trench structure to the top of the buffer layer 200, may be about 0.1 μm to about 1.0 μm. When the distance is within the range, the normally-off operation may be smoothly implemented.

The p type layer 500 includes a p type semiconductor material, for example, NiOX ($0.98 \leq x \leq 1$).

In a case of a structure in which the gate insulating layer and the gate electrode are sequentially disposed on the protective layer and on the n− type epitaxial layer without forming the p type layer, there may be a problem of applying a strong negative (−) voltage in order to keep a semiconductor device in an off state, and in this off state, since the gate insulating layer at the bottom of the gate electrode may be easily destroyed, there is a limit to an increase in a breakdown voltage, because.

According to an embodiment, when the p type layer 500 is disposed to form the trench structure on the protective layer 400 and through the protective layer 400 into the n− type epitaxial layer 300 is applied, a depletion layer may be formed between the p type semiconductor material of the p type layer 500 and the n− type gallium oxide ($Ga_2O_3$) of the n− type epitaxial layer 300, thereby implementing the normally-off operation. In addition, a thickness of the depletion layer may be controlled by a gate voltage to control an amount of MOSFET current and also, on/off of the semiconductor device. Furthermore, the p type semiconductor material applied thereto may protect a gate insulating layer described later and disperse an electric field in an off state, increasing a breakdown voltage.

The gate insulating layer 600 may be disposed on the p type layer 500 and formed along the upper surface of the p type layer 500 formed as the trench structure.

The gate insulating layer 600 may include $Al_2O_3$, $SiO_2$, $HfO_2$, $Si_2N_3$, or a combination thereof but is not limited thereto.

In a case of a structure wherein the p type layer and the gate electrode are sequentially disposed on the protective layer and the n− type epitaxial layer without the gate insulating layer, the normally-off operation may be implemented by the depletion layer formed on a PN junction by applying the p type semiconductor material, but a certain leakage current may occur even in an off state. In addition, in an on state of a switching device, the PN structure in a gate region may be turned on, making it impossible to apply a gate voltage beyond a certain level.

According to an embodiment, the gate insulating layer 600, which is formed between the p type layer 500 and the gate electrode 700, may suppress a gate leakage current but increase a threshold voltage.

In addition, according to an embodiment, since the thickness of the n− type epitaxial layer, which is a channel region through etching for forming the trench structure, is controlled, the normally-off operation may be implemented, the threshold voltage may be controlled, and in addition, a current may be increased due to the increased doping concentration of the n− type epitaxial layer.

The gate electrode 700 may be disposed on the gate insulating layer 600 to internally fill the trench structure. The gate electrode 700 may include a metal.

Figure 2:
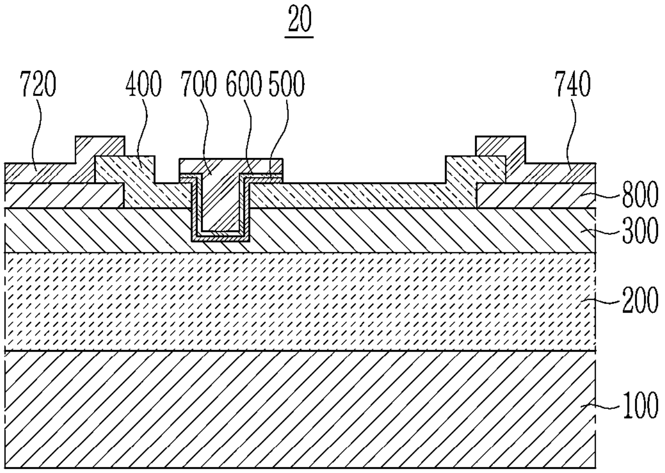
FIG. 2 is a view briefly illustrating a cross section of a semiconductor device according to another embodiment.

FIG. 2 is a view briefly illustrating a cross section of a semiconductor device according to another embodiment. Herein, the description of the same parts as in FIG. 1 is omitted.

Referring to FIG. 2, a semiconductor device 20 according to another embodiment may further include an n+ type epitaxial layer 800, a source electrode 720, and a drain electrode 740.

The n+ type epitaxial layer 800 may be disposed on the n− type epitaxial layer 300 with a structure in contact with a portion of the protective layer 400 and respectively positioned below each region where a source electrode and a drain electrode described later are formed.

The n+ type epitaxial layer 800 may include an n+ type gallium oxide ($Ga_2O_3$) and optionally, an Si or Sn-doped n+ type gallium oxide.

Hereinafter, a method of manufacturing the semiconductor device according to FIG. 1 is illustrated with reference to FIGS. 3 to 10, and a method of manufacturing the semiconductor device according to FIG. 2 is illustrated with reference to FIGS. 11 to 20. These drawings show an example of the methods of manufacturing a semiconductor device but are not limited thereto.

FIGS. 3 to 10 are views sequentially showing a method of manufacturing a semiconductor device according to an embodiment. Herein, since the materials of each layer are the same as described above, their descriptions are omitted.

Figure 3:
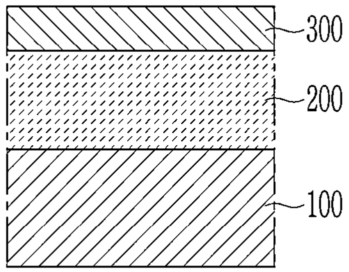
FIG. 3 is a view sequentially showing a method of manufacturing a semiconductor device according to an embodiment.

Referring to FIG. 3, the substrate 100 is prepared, and the buffer layer 200 and the n− type epitaxial layer 300 are sequentially formed on the substrate 100.

The n− type epitaxial layer 300 may be formed through epitaxial growth.

Figure 4:
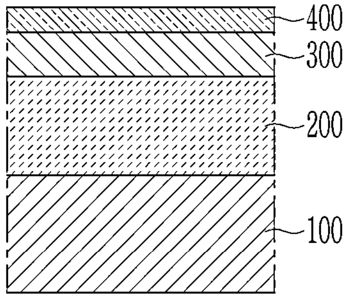
FIG. 4 is a view sequentially showing a method of manufacturing a semiconductor device according to an embodiment.
Figure 5:
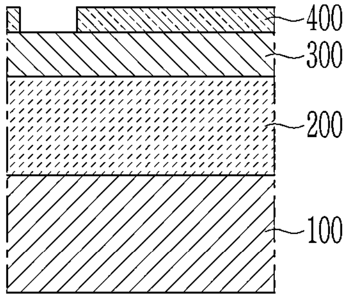
FIG. 5 is a view sequentially showing a method of manufacturing a semiconductor device according to an embodiment.

Referring to FIGS. 4 and 5, the protective layer 400 is formed on the n− type epitaxial layer 300, and a portion of the protective layer 400 is etched.

Figure 6:
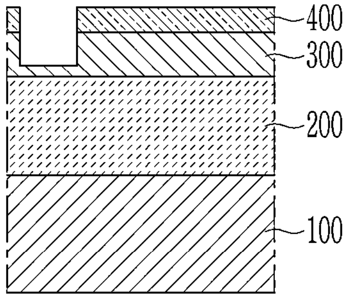
FIG. 6 is a view sequentially showing a method of manufacturing a semiconductor device according to an embodiment.

Referring to FIG. 6, a trench structure is formed by etching a portion inside the n− type epitaxial layer 300 through the protective layer 400.

Figure 7:
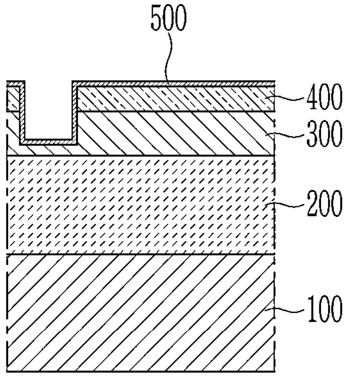
FIG. 7 is a view sequentially showing a method of manufacturing a semiconductor device according to an embodiment.

Referring to FIG. 7, the p type layer 500 is formed along the formed trench structure on the protective layer 400 and the n− type epitaxial layer 300.

Figure 8:
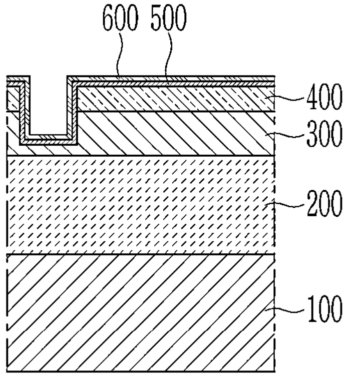
FIG. 8 is a view sequentially showing a method of manufacturing a semiconductor device according to an embodiment.
Figure 9:
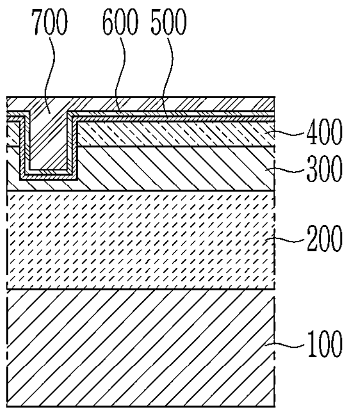
FIG. 9 is a view sequentially showing a method of manufacturing a semiconductor device according to an embodiment.
Figure 10:
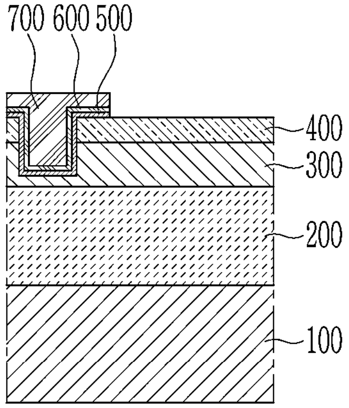
FIG. 10 is a view sequentially showing a method of manufacturing a semiconductor device according to an embodiment.

Referring to FIGS. 8 to 10, on the p type layer 500, the gate insulating layer 600 and the gate electrode 700 are sequentially formed.

The p type layer 500, the gate insulating layer 600, and the gate electrode 700 may be formed by sequentially depositing a p type layer material, a gate insulating layer material, and a gate electrode material and then, performing a lift-off process or an etching process. Herein, the lift-off process may be performed by coating a photosensitive layer after forming the trench structure and then, patterning it, sequentially depositing the p type layer material, the gate insulating layer material, and the gate electrode material, and then, removing the photosensitive layer.

FIGS. 11 to 20 are views sequentially showing a method of manufacturing a semiconductor device according to another embodiment. Herein, since the materials of each layer are the same as described above, their descriptions are omitted.

Figure 11:
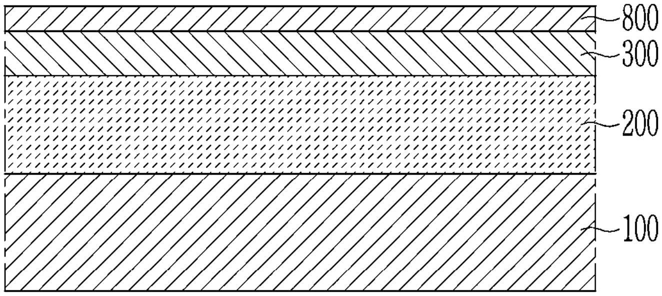
FIG. 11 is a view sequentially showing a method of manufacturing a semiconductor device according to another embodiment.

Referring to FIG. 11, the substrate 100 is prepared, and then, the buffer layer 200, the n− type epitaxial layer 300, and the n+ type epitaxial layer 800 may be sequentially formed on the substrate 100.

The n− type epitaxial layer 300 and the n+ type epitaxial layer 800 may be respectively formed through epitaxial growth.

Figure 12:
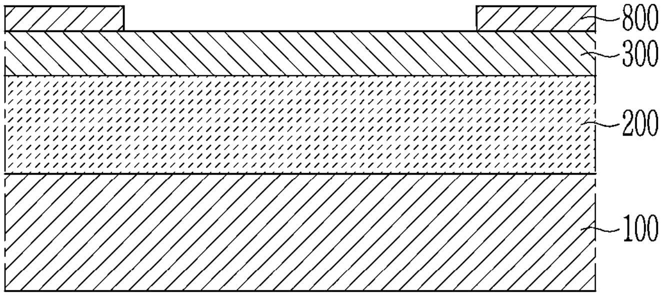
FIG. 12 is a view sequentially showing a method of manufacturing a semiconductor device according to another embodiment.

Referring to FIG. 12, a portion of the n+ type epitaxial layer 800 is etched.

Figure 13:
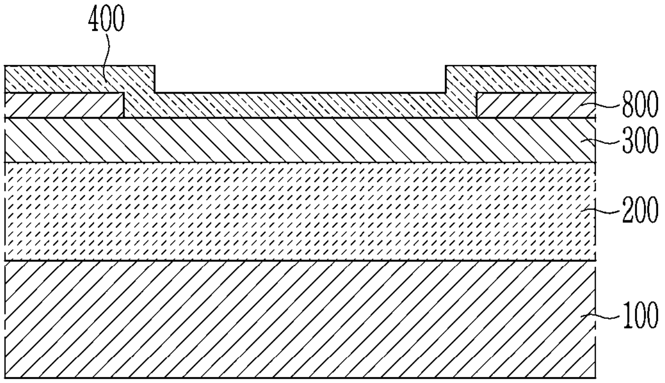
FIG. 13 is a view sequentially showing a method of manufacturing a semiconductor device according to another embodiment.
Figure 14:
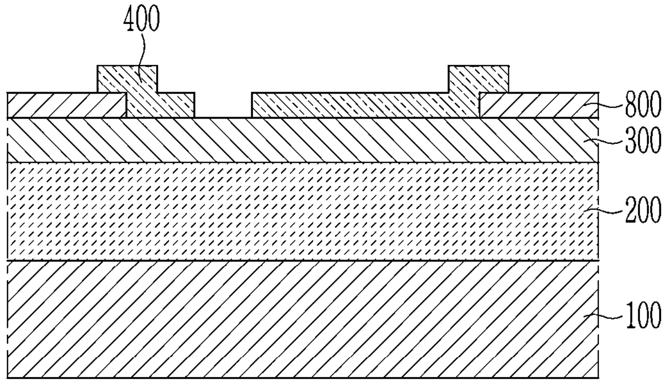
FIG. 14 is a view sequentially showing a method of manufacturing a semiconductor device according to another embodiment.

Referring to FIGS. 13 and 14, on the n− type epitaxial layer 300 and the n+ type epitaxial layer 800, the protective layer 400 is formed, and a portion of the protective layer 400 is etched.

Figure 15:
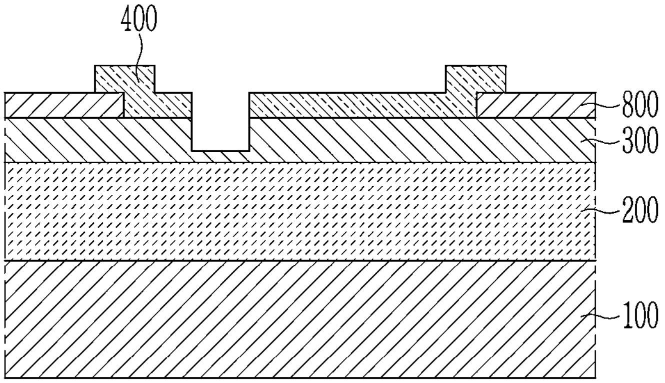
FIG. 15 is a view sequentially showing a method of manufacturing a semiconductor device according to another embodiment.

Referring to FIG. 15, a portion of the n− type epitaxial layer 300 is etched through the protective layer 400 to form a trench structure.

Figure 16:
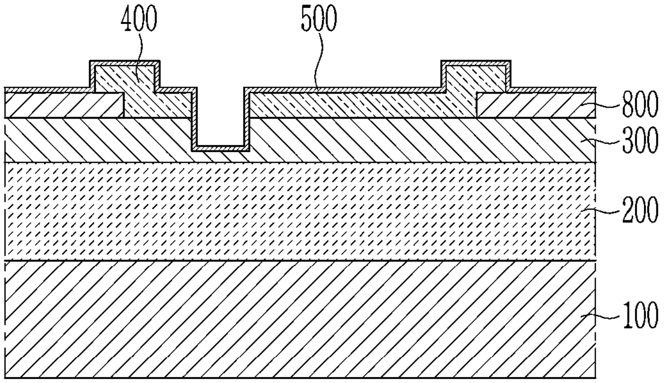
FIG. 16 is a view sequentially showing a method of manufacturing a semiconductor device according to another embodiment.

Referring to FIG. 16, the p type layer 500 may be formed along the formed trench structure on the n+ type epitaxial layer 800, the protective layer 400, and the n− type epitaxial layer 300.

Figure 17:
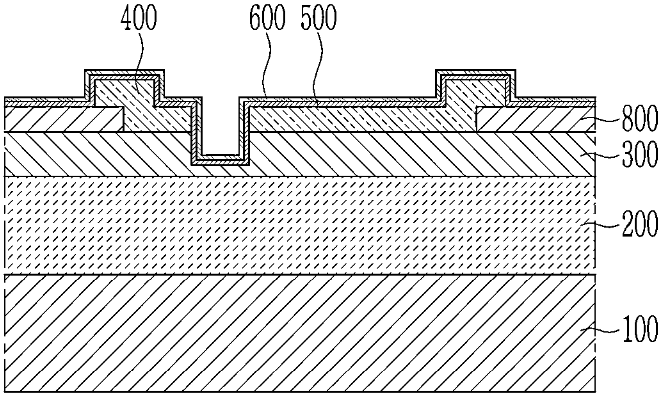
FIG. 17 is a view sequentially showing a method of manufacturing a semiconductor device according to another embodiment.
Figure 18:
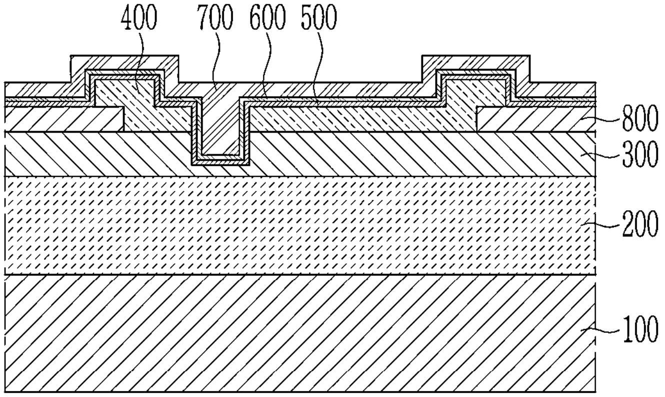
FIG. 18 is a view sequentially showing a method of manufacturing a semiconductor device according to another embodiment.
Figure 19:
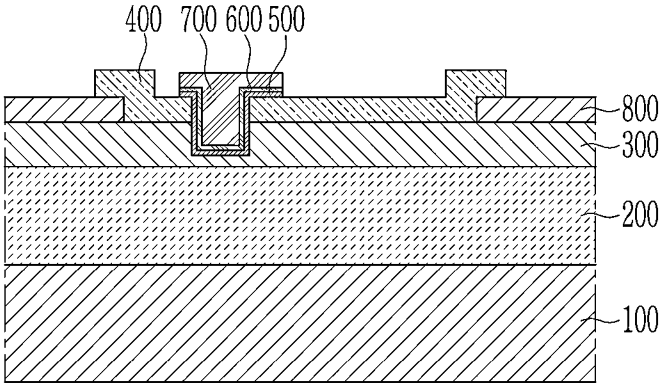
FIG. 19 is a view sequentially showing a method of manufacturing a semiconductor device according to another embodiment.

Referring to FIGS. 17 to 19, on the p type layer 500, the gate insulating layer 600 and the gate electrode 700 may be sequentially formed.

The p type layer 500, the gate insulating layer 600, and the gate electrode 700 may be formed by sequentially depositing a p type layer material, a gate insulating layer material, and a gate electrode material and then, performing a lift-off process or an etching process. Herein, the lift-off process may be performed by coating a photosensitive layer after forming the trench structure and then, patterning it, sequentially depositing the p type layer material, the gate insulating layer material, and the gate electrode material, and then, removing the photosensitive layer.

Figure 20:
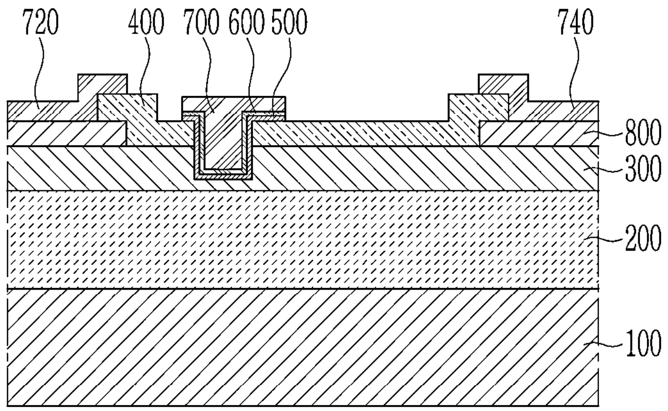
FIG. 20 is a view sequentially showing a method of manufacturing a semiconductor device according to another embodiment.

Referring to FIG. 20, on the n+ type epitaxial layer 800 and the protective layer 400, the source electrode 720 and the drain electrode 740 are respectively formed.

The source electrode 720 and the drain electrode 740 may be formed through the lift-off process. Specifically, the lift-off process, as shown in FIG. 19, may be performed by coating a photosensitive layer after forming the gate electrode 700 with the trench structure and then, patterning it, depositing a source electrode material and a drain electrode material in order, and removing the photosensitive layer.

As not shown in the drawings, but according to another embodiment, as shown in FIG. 17, after forming the gate insulating layer 600 on the p type layer 500, portions of the p type layer 500 and the gate insulating layer 600 are first etched, and then, the gate electrode material, the source electrode material, and the drain electrode material may be sequentially deposited and then, etched together to simultaneously form the source electrode 720 and the drain electrode 740 may be with the gate electrode 700.

According to the methods of manufacturing semiconductor devices, a semiconductor device with a MOSFET structure capable of implementing a normally-off operation without an ion implantation process may be manufactured.

While this invention has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A semiconductor device, comprising:
a substrate;
a buffer layer on the substrate;
an n− type epitaxial layer on the buffer layer;
an n+ type epitaxial layer on the n− type epitaxial layer;
a protective layer on the n− type epitaxial layer;
a p type layer disposed in a trench structure on the protective layer, and penetrating the protective layer and within the n− type epitaxial layer;
a gate insulating layer on the p type layer; and
a gate electrode on the gate insulating layer.

2. The semiconductor device of claim 1, wherein
the semiconductor device further includes
a source electrode on the n+ type epitaxial layer and the protective layer; and
a drain electrode on the n+ type epitaxial layer and the protective layer.

3. The semiconductor device of claim 1, wherein
the p type layer includes NiOx ($0.98 \leq x \leq 1$).

4. The semiconductor device of claim 1, wherein
the buffer layer includes unintentionally doped (UID) gallium oxide.

5. The semiconductor device of claim 1, wherein
the n− type epitaxial layer includes n− type gallium oxide.

6. The semiconductor device of claim 5, wherein
the n− type epitaxial layer has a concentration of 1E16 $cm^{-3}$ to 1E19 $cm^{-3}$.

7. The semiconductor device of claim 1, wherein
the protective layer includes $SiO_2$, $Si_2N_3$, or a combination thereof.

8. The semiconductor device of claim 1, wherein
the gate insulating layer includes $Al_2O_3$, $SiO_2$, $HfO_2$, $Si_2N_3$ or a combination thereof.

9. The semiconductor device of claim 1, wherein
the n+ type epitaxial layer includes n+ type gallium oxide.

10. A method of manufacturing a semiconductor device, comprising:
sequentially forming a buffer layer and an n− type epitaxial layer on a substrate;
forming and etching an n+ type epitaxial layer on the n− type epitaxial layer;
forming a protective layer on the n− type epitaxial layer and the n+ type epitaxial layer;
etching the protective layer and etching a portion of the n− type epitaxial layer through the protective layer to form a trench structure;
forming a p type layer on the protective layer and the n− type epitaxial layer along the trench structure;
forming a gate insulating layer on the p type layer; and
forming a gate electrode on the gate insulating layer.

11. The method of claim 10, wherein
the forming of the p type layer, the gate insulating layer, and the gate electrode is performed by a lift-off process or an etching process.

12. The method of claim 10, wherein
after the forming of the gate electrode,
the method further includes forming a source electrode and a drain electrode on the n+ type epitaxial layer and the protective layer.

13. The method of claim 12, wherein
after the forming of the gate electrode, the forming of the source electrode and the drain electrode is performed by a lift-off process or an etching process.

14. The method of claim 10, wherein
at the same time as forming the gate electrode,
the method further includes forming a source electrode and a drain electrode on the n+ type epitaxial layer and the protective layer.

15. The method of claim 14, wherein
at the same time as forming the gate electrode, the forming of the source electrode and the drain electrode includes sequentially depositing a gate electrode material, a source electrode material, and a drain electrode material on the gate insulating layer and performing a lift-off process or an etching process.

16. The method of claim 10, wherein
the p type layer includes NiOx ($0.98 \leq x \leq 1$).

* * * * *